United States Patent
Hayashi

(10) Patent No.: US 7,000,201 B2
(45) Date of Patent: Feb. 14, 2006

(54) EVALUATION TEG FOR SEMICONDUCTOR DEVICE AND METHOD OF EVALUATION

(75) Inventor: Hirokazu Hayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 140 days.

(21) Appl. No.: 10/780,938

(22) Filed: Feb. 19, 2004

(65) Prior Publication Data

US 2004/0163071 A1   Aug. 19, 2004

(30) Foreign Application Priority Data

Feb. 19, 2003   (JP)   ............................. 2003-041561

(51) Int. Cl.
*G06F 17/50*   (2006.01)

(52) U.S. Cl. ............................................. 716/4; 716/5

(58) Field of Classification Search ................ 716/4–5, 716/11, 18; 438/17–18; 324/658, 763, 765; 257/48

See application file for complete search history.

(56) References Cited

U.S. PATENT DOCUMENTS 6,470,479 B1 * 10/2002 Yamamoto ...................... 716/4
6,530,066 B1 *  3/2003 Ito et al. ......................... 716/5

FOREIGN PATENT DOCUMENTS

JP   7-260867   10/1995

* cited by examiner

*Primary Examiner*—Paul Dinh
(74) *Attorney, Agent, or Firm*—Takeuchi&Kubotera,LLP

(57) ABSTRACT

An evaluation TEG for evaluating a semiconductor device including an SOI structure and a LOCOS having a birdbeak portion comprises two electrodes 10 and 20 having different electrode widths sufficiently large to disregard the length of the LOCOS birdbeak portion and an electrode 30 having an extremely small width substantially equal to the length of the birdbeak portion. All the electrode have the same length and are connected to test pads 10*a*, 20*a*, and 30*a*, respectively. The capacitance of a parasitic transistor is easily extracted by using the evaluation TEG and the evaluation of parameters causing the hump characteristics is become possible.

11 Claims, 9 Drawing Sheets

EVALUATION TEG FOR SEMICONDUCTOR DEVICE AND METHOD OF EVALUATION

BACKGROUND OF THE INVENTION

1. Field of the Invention

The present invention relates to an evaluation TEG (test element group) in an element having an SOI structure, which is capable of extracting a capacitance of a parasitic transistor in an edge region, which is produced by an LOCOS, and a method of estimating an effective film thickness and impurity density of the parasitic transistor without breakdown of the device.

2. Description of the Related Art

In a semiconductor device using a SOI (silicon on insulator) substrate, a parasitic transistor is formed in an edge between a silicon layer and a LOCOS (local oxidation of silicon) oxide film. A structure of the parasitic transistor is shown in FIG. 10(a).

In FIG. 10(a), a BOX layer 110, which is an oxide layer, an SOI layer 120, a gate oxide layer 130, and an electrode 140 are formed on a bulk layer 100 in this order. Each element is separated by a LOCOS 150 and a parasitic transistor is formed in a birdbeak (parasitic) portion P of the LOCOS 150 surrounded by a circle.

The parasitic transistor causes hump characteristics (increase of leakage current) in the basic characteristics of MOSFET (MOS field effect transistor) of the SOI. In order to evaluate the hump characteristics, a sectional SEM observation method, wherein a wafer is cut for monitor, and other method, wherein a process factor is estimated from the process dependency of the sub-threshold characteristics, are used. In FIG. 11, are shown the sub-threshold characteristic of gates formed by various processes.

The former method, the sectional SEM observation method using photographs, is to directly inspect a sectional structure. The latter method using the sub-threshold characteristic is to monitor the appearance of the hump by changing process conditions for causing the hump.

An example of the prior art using the evaluation TEG is disclosed in Japanese Patent Application Kokai Number 7-260867, although it does not correspond to the SOI structure. In the evaluation TEG, the area of the gate and the shapes of the gate and the LOCOS birdbeak portion can be handled as independent parameters. A transistor sample for evaluation use is formed with such an evaluation TEG for evaluating the reliability of the gate oxide film. Even an unrealistic gate oxide film can be easily formed and evaluated by the evaluation TEG. An accurate evaluation result can be obtained quickly by a simple operation.

However, there are problems in the prior art mentioned below.

(1) An expensive SOI wafer is broken down in the sectional SEM observation method.
(2) A wafer used for the sectional SEM observation method and an actual wafer subject to an electrical test are not always identical because a sample for the sectional SEM observation method requires a relatively large dimension, while a sample for the electrical test is small.
(3) In the latter method for evaluating the factor of the hump characteristics from the process dependency (the impurity density and oxide film thickness) of the sub-threshold characteristics, it is difficult to judge which is a real factor, the impurity density is small or the gate oxide film in the edge region is thick.

Also, a plurality of wafers are required for changing the process conditions.

SUMMARY OF THE INVENTION

Accordingly, it is an object of the invention to provide a new and improved evaluation TEG for semiconductor device and an evaluation method capable of easily extracting the capacitance of a parasitic transistor and estimating the shape of the parasitic transistor without breakdown of a wafer, and estimating the factor of the hump characteristics in a short time.

According to an aspect of the present invention, there is provided an evaluation test element group (TEG) for evaluating a semiconductor device including an SOI structure and a LOCOS having a birdbeak portion (parasitic portion), wherein evaluation TEG comprises at least two first type electrodes having different electrode widths sufficiently large to disregard the length of the birdbeak portion and a second type electrode having an extremely small width substantially equal to the length of the birdbeak portion. All the electrode are the same length and connected to test pads, respectively.

The LOCOS birdbeak portions (parasitic portions) are formed only at ends of the electrode and have lengths as small as approximately 0.1 $\mu$m, which is constant regardless their widths. Here, "disregard the length of the birdbeak portion" regarding widths of the first type electrodes means that the width of the birdbeak portion can be disregarded by making the widths of the electrodes sufficiently large. It is preferable that the widths of the electrodes are substantially more than ten times the thickness of the SOI layer, which is taken as substantially same as the length of the birdbeak portion. Also, "substantially equal to the length of the birdbeak portion" of the second type electrode means that the width of the birdbeak portion cannot be disregarded by making the width of the second type electrode sufficiently small, thus it is considered that the electrode structure is composed of the center portion and edge portion. It is preferable that the width of the second electrode is substantially same as the thickness of the SOI layer.

The capacitance between the respective electrodes and the substrate is considered to be the sum of the main region component (in the center of the electrode) and parasitic region component (in the edge of the electrode). That is, in en electrode having a large width, the parasitic region component can be disregarded and in an electrode having a small width, the parasitic region component cannot be disregarded. Since the capacitance of the electrode having a large width is variable depending upon the width, the linear relationship of the capacitance with respect to the width can be found. The capacitance of the parasitic portion is found from the linear relationship and the capacitance of an electrode having a small width.

It is preferable that the TEG has a comb-shaped structure having a plurality of fingers because a large electrode area with many fingers makes the measurement accurate.

It is preferable that the TEG is arranged in positions having no real element, such as scribe line, in order not to reduce the number of real elements in a wafer.

According to another aspect of the invention, there is provided a method of finding the capacitance of a parasitic transistor and evaluating characteristics of a MOS of the real elements by finding, from the capacitance of the parasitic transistor, any of a thickness of the oxide film in the parasitic portion, a thickness of the SOI layer in the parasitic portion, and an impurity density of the SOI layer in the parasitic portion.

It is preferable that the capacitance of the birdbeak portion is found by simplifying a sectional shape of the birdbeak portion as a substantially rectangular.

The method of finding the capacitance of the birdbeak portion comprises the steps of measuring the capacitance by applying a predetermined voltage between the respective electrode pads and the substrate, finding a linear relationship of the capacitance of the electrode having a large width from the measured capacitance, finding a theoretical capacitance of the electrode having a small width, and subtracting the theoretical capacitance from the measured capacitance of the electrode with the small width.

The thickness of the oxide film in the birdbeak is calculated from the capacitance and area of the birdbeak portion in the accumulated region.

The thickness of the SOI layer in the birdbeak portion is found by subtracting a product of a growth ratio of the oxide film on a silicon side and the thickness of the oxide film in the birdbeak portion from a thickness of the SOI film in the main region.

The electrode is made of a poly-silicon and the degree of a depletion of the electrode in the birdbeak portion is calculated from the capacitance of the birdbeak portion to evaluate characteristics of a MOS.

The degree of the depletion of the electrode is obtained by the steps of finding the capacitance of the birdbeak portion in an accumulation region, calculating the thickness of the oxide film in the birdbeak portion in the accumulation region, finding the capacitance of the birdbeak portion in an inversion region, calculating the thickness of the oxide film in the birdbeak portion in the inversion region, and comparing the thicknesses of the oxide films in the birdbeak portion in the accumulation and inversion regions.

Also, there is provided a method of evaluating a semiconductor device having electrodes made of a poly-silicon, which includes the steps of finding the capacitance of the birdbeak portion in a weak inversion region (parameter 1), finding the thickness of the oxide film in the birdbeak portion (parameter 2), finding the thickness of the SOI layer in the birdbeak portion (parameter 3), finding the degree of each depletion of the electrodes in the birdbeak portion (parameter 4), and calculating the impurity density of the SOI layer in the birdbeak portion by using the parameters 1–4.

Using the evaluation TEG, the capacitance of the birdbeak portion is found and the thicknesses of the oxide film and SOI layer, the degree of the depletion in the electrode and the impurity density of the SOI layer in birdbeak portion are obtained from the capacitance, thus making it possible to evaluate the parameters causing the hump characteristics.

When the hump characteristics are found in the wafer inspection, the above parameters can be checked by using the TEG provided in each wafer to investigate causes immediately and feedback to the wafer fabrication process.

In addition, it is not necessary to cut a wafer for the SEM observation or assuming causes from the sub-threshold characteristics of the gate which has been formed by various process. Accordingly, the evaluation time is extremely reduced and the wafer cost is reduced in mass-production.

DESCRIPTION OF THE PREFERRED EMBODIMENTS

Figure 1A:
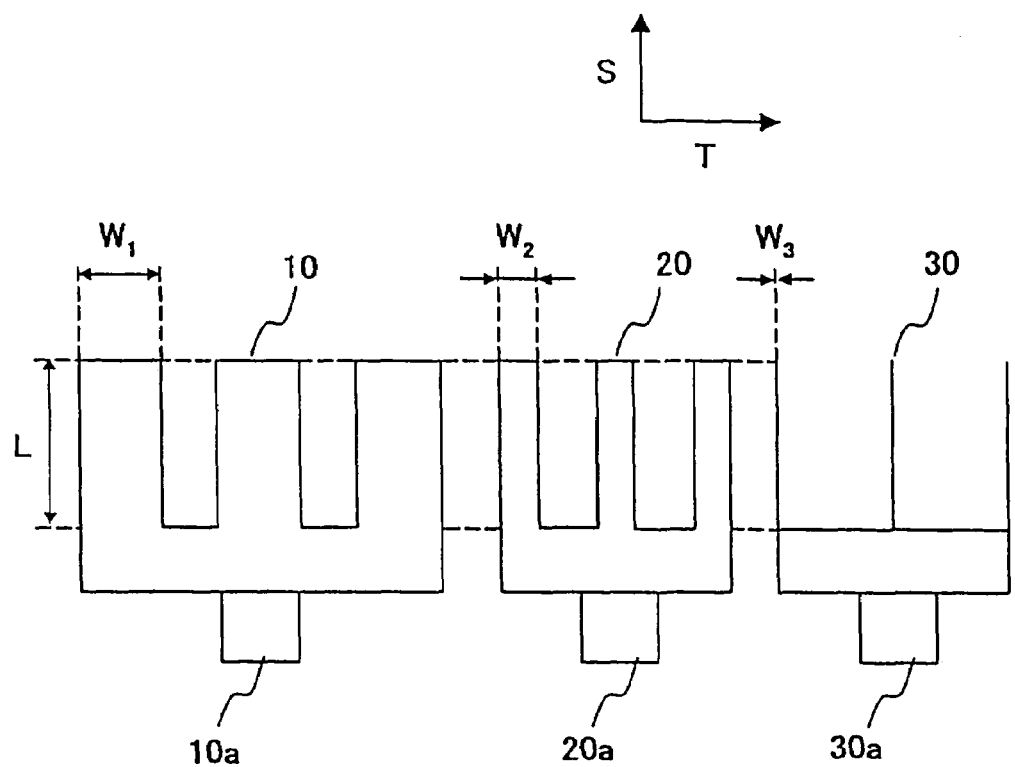
FIGS. 1(a) and (b) are top and sectional views, respectively, of an evaluation TEG according to the first embodiment of the present invention.

Preferred embodiments of the present invention will now be described with reference to the accompanying drawings. Elements having substantially identical functions are given the same reference numerals in the specification and drawings and overlapped description will be omitted.

(First Embodiment)

In FIG. 1, a structure of an evaluation TEG according to the first embodiment is shown, which is capable of extracting a capacitance of a MOS of an SOI structure using a LOCOS element separation technology.

As shown in FIG. 1(a), the evaluation TEG comprises first, second, and third electrodes 10, 20, and 30, which have of a comb-shaped pattern with, for example, three fingers. The first, second, and third electrodes 10, 20, and 30 have the same length in the first direction S. The first and second electrodes 10 and 20 have relatively large widths W1 and W2, respectively, in the second direction T. However, the third electrode 30 has an extremely small width W3, which is substantially equal to a birdbeak portion of a LOCOS.

The first, second, and third electrodes 10, 20, and 30 all together form the TEG. The fingers of the three electrodes have the same length L. The electrodes of the evaluation TEG according to this embodiment are made of a poly-silicon. Also, a plurality of pads 10a, 20a, and 30a are formed in the respective electrodes 10, 20, and 30, respectively, to apply voltage between the electrodes and the substrate for measuring capacitance in the third direction U perpendicular to the first and second directions S and T.

It is preferable to increase a number n of the electrode finger and make large the electrode length as much as the pattern size permits because a measurement error of the capacitance is reduced when the electrode area is large. The electrode lengths of the respective electrodes are, however, required to be the same in order to obtain a relation between the capacitance and the electrode width.

Figure 1B:
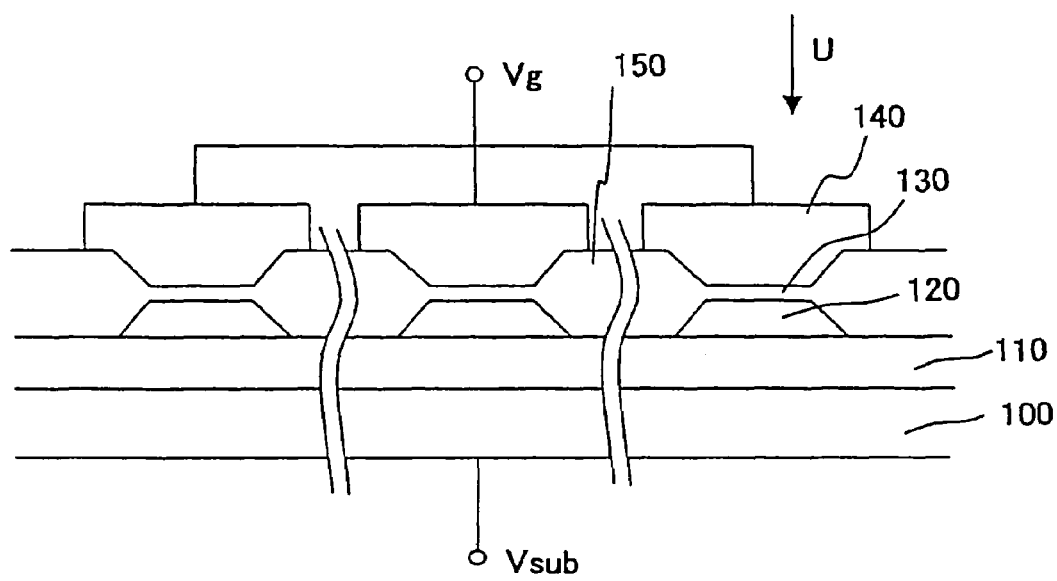
Figure 2A:
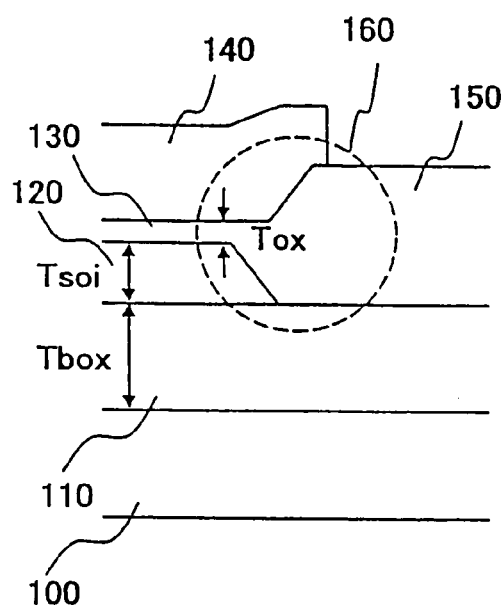
FIG. 2(a) is a sectional view of a parasitic region according to the first embodiment of the present invention.

FIG. 1(b) is a sectional view of the pattern of one of the electrodes of FIG. 1(a) (for example, W3). In FIG. 1(b), a BOX layer 110, which is an oxide layer, an SOI layer 120, a gate oxide layer 130, and an electrode 140 are formed on a bulk layer 100 in this order. The respective fingers and the respective electrodes are separated by a LOCOS 150. The structure of a birdbeak portion (parasitic region) 160 of the LOCOS is shown in a circle of FIG. 2(a). Both edges of the electrode 140 have this structure. The structure is identical to that of a parasitic transistor which is produced in the birdbeak portion of the LOCOS of an actual device.

Figure 2B:
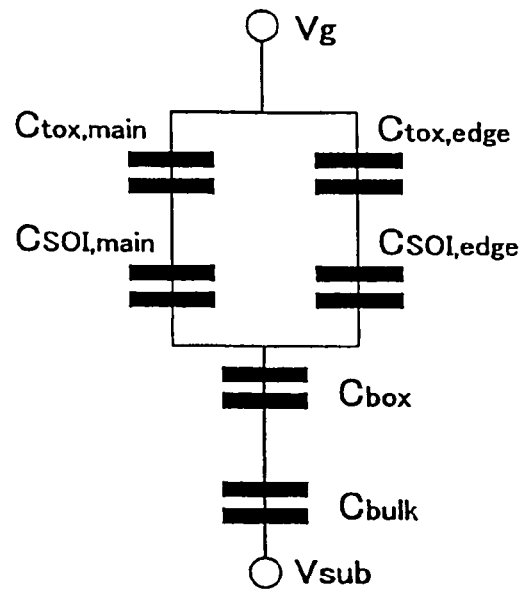
FIG. 2(b) is a diagram, showing a capacitance of the parasitic region of FIG. 2(a).

FIG. 2(b) is as equivalent capacity drawing of the TEG electrodes (MOS gate). It is considered as a circuit on the BOX layer, in which capacities of an SOI layer ($C_{SOI,main}$) and a gate oxide film ($C_{tox,main}$) in a main electrode region, and capacities of the SOI layer ($C_{SOI,edge}$) and the gate oxide film ($C_{tox,edge}$) in a parasitic region are connected in parallel.

The capacitance of each electrode in the TEG is obtained by measuring the capacity between Vg and Vsub in the third direction U. That is, the total capacitance $C_{total}$ of the electrode to be measured is equal to the sum of capacitances of the main region component $C_{main}$ of the center of the electrode and the parasitic region component $C_{edge}$ of the LOCOS birdbeak portion ($C_{total}=C_{main}+C_{edge}$). The main region component $C_{main}$ is proportional to the width W of the electrode and the parasitic region component $C_{edge}$ is constant regardless the width W.

Figure 3:
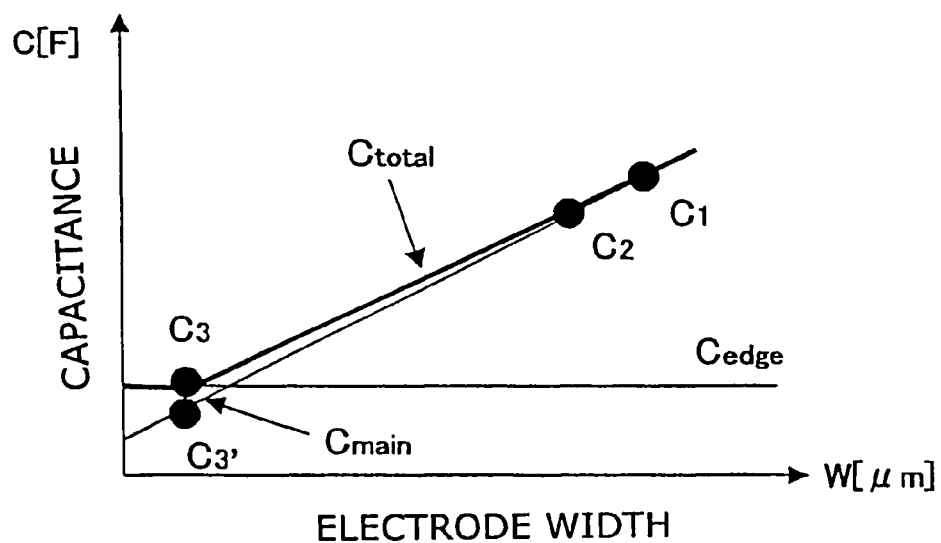
FIG. 3 is a graph showing a relation between a width W of a TEG gate and a total capacitance of a main region and the parasitic region according to the first embodiment of the present invention.

The capacitance of the MOS gate pattern having a large width W is almost equal to the capacitance $C_{main}$ of the main region because the capacitance $C_{edge}$ of the parasitic region is small enough to neglect. By contrast, in the capacitance of the MOS gate pattern having a small width W, the capacitance $C_{edge}$ of the parasitic region component occupies main portion and the capacitance $C_{main}$ of the main region is relatively small. Accordingly, in order to extract the capacitance $C_{edge}$ of the parasitic region, as shown in FIG. 3, capacitances C1 and C2 of the first and second electrodes having large widths W are plotted to extract a slope of the linear function between the capacitance and the electrode width W. Then, a capacitance value C3' (main region component) theoretically calculated from the slope is subtracted from a capacitance C3 of the third electrode, which has an extremely small width W, to obtain the parasitic region capacitance $C_{edge}$. The obtained parasitic region capacitance $C_{edge}$ is more accurate when the electrode width W3 of the third electrode is smaller.

Here, the values of the respective electrode widths W (W1–W3) in the TEG are exampled below. The widths W1 and W2 are required to be large enough to disregard the thickness of the edge region (ΔW). The edge region thickness ΔW is assumed to be substantially same as that of the SOI film. The thickness of a complete depletion type SOI is approximately 0.02 μm and the thickness of a partial depletion type SOI is approximately 0.2 μm. It is preferable that the respective widths W1 and W2 of the first and second electrodes are at least more than ten times dimension of the LOCOS birdbeak portion in the widthwise direction thereof. For example, if the thickness of the SOI according to this embodiment is 0.05 μm, the ΔW of the birdbeak region is assumed to be 0.05 μm. In this case, it is preferable that the widths W1, W2, and W3 are 10 μm, 5 μm, and 0.2 μm, respectively.

Also, as described above, a relatively large area is important for accurate measurement of the capacitance. Accordingly, it is preferable that the length and area of the electrode are more than approximately 100 μm and 2,000 μm², respectively. It is necessary to increase the length of the electrode and the number n of electrode fingers as much as possible to increase the area.

It was described above that the edge region width ΔW can be assumed substantially same as the thickness of the SOI film. Reasons therefor will be described below. In the growth of an oxide film, in which oxygen ($O_2$) and silicon (Si) are reacted to make an oxide film ($SiO_2$), oxidation usually progresses in isotropic directions so that the oxide film is developed by the same distance in depthwise (vertical) direction and lateral (horizontal) direction. Accordingly, in case that the thickness of the SOI film is 0.05 μm, while the oxidation in the depthwise direction starts from the interface of $Si/SiO_2$ and arrives at the BOX layer, the oxidation advances in the lateral direction by the same length (in this case, 0.05 μm) too. The shape of the edge portion is a triangle, primarily, however, it is defined that the edge region width ΔW is, approximately, the same as the thickness of the SOI film.

Figure 6A:
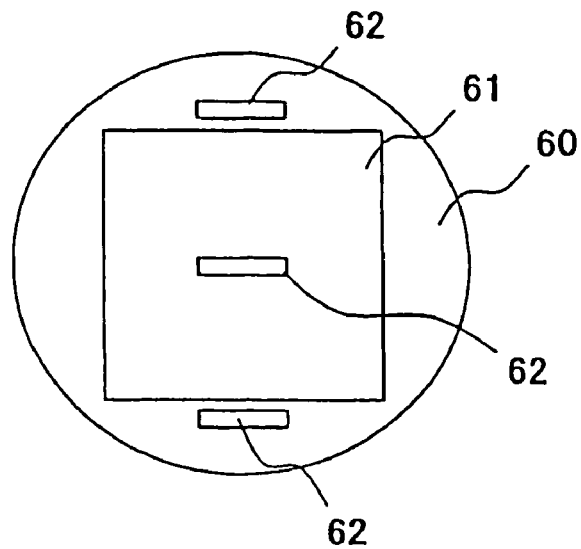
FIGS. 6(a) (b) (c) are diagrams showing positions of the TEGs, wherein (a) shows a case before mass-production, (b) shows a case upon mass-production, and (c) shows a case upon mass-production, especially a case the TEGs are arranged at a scribe line.
Figure 6B:
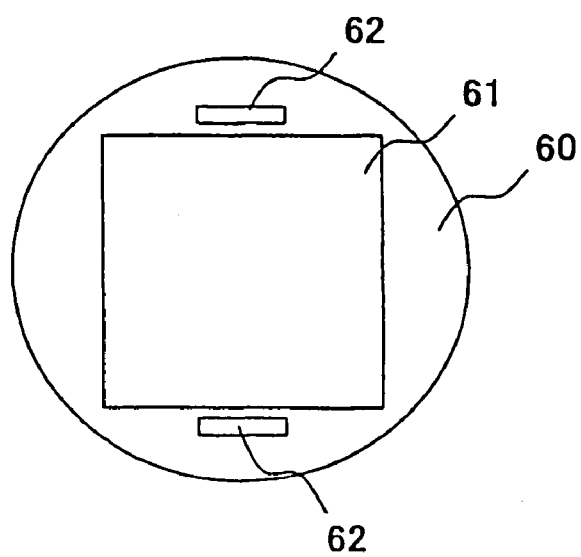
Figure 6C:
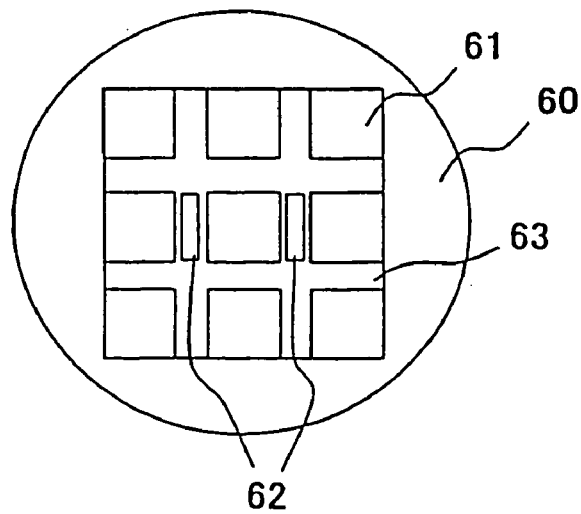

The positioning of the TEG in a wafer will be described. Before mass-production, it is desirable that TEGs 62 are positioned in a wafer 60 uniformly, as shown in FIG. 6(a), to monitor the distribution of the thickness of the oxide film in the wafer and the temperature of heat treatment, wherein the distribution is caused by the deviation of process factors. However, when mass-production, it is desirable that the TEGs 62 are positioned, as shown in FIG. 6(b), in an area except for an area where real elements 61 are formed, in order to make the area for the real elements 61 as large as possible. It is because the TEGs 62 in mass-production are used only for judging if the elements are abnormal. Also, if the evaluation TEGs 62 are disposed, as shown in FIG. 6(c), in a scribe-lines area 63 for separating chips, the evaluation TEGs 62 are in the vicinity of the real elements to be evaluated so that more accurate evaluation becomes possible.

Figure 7:
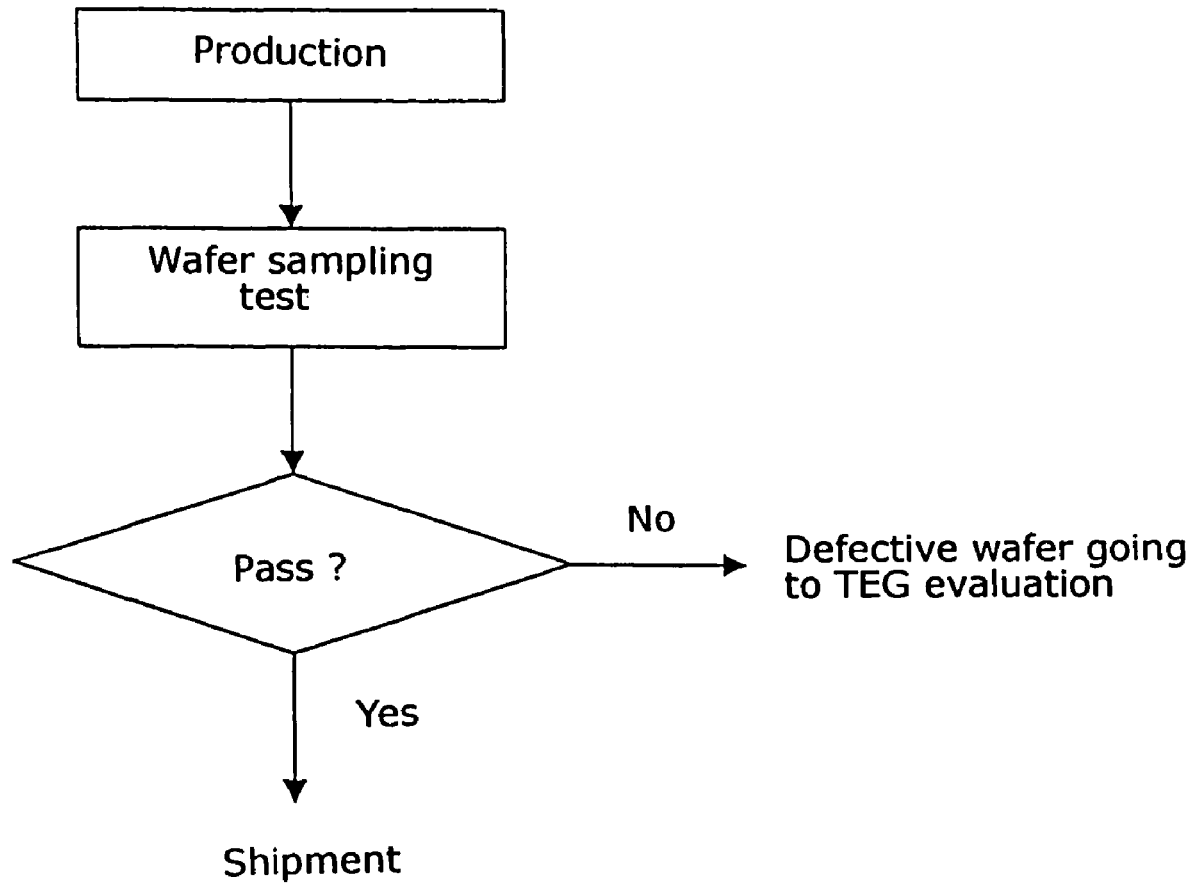
FIG. 7 is a flow chart for evaluating a wafer.

The evaluation flow upon mass-production is shown in FIG. 7. Upon mass-production, several wafers are sampled to check if they are good or defective. Since this sampling test is to simply check off-leakage (leakage current flowing in off-condition of a device) and so forth, even when a sampled wafer was found defective, it was not possible to judge immediately what made the wafer defective. However, if the evaluation TEGs are formed in part of the wafer, immediate judgement about the normality or abnormality of the wafers becomes possible, which provides important data for searching the reason of the abnormality.

As described above, an evaluation TEG according to the invention evaluates a semiconductor device including a substrate, a dielectric layer, and an SOI layer formed in this order and further including a local oxidation of silicon (LOCOS) having a birdbeak portion The evaluation TEG comprises a first electrode extending in a first direction and a second direction crossing the first direction, a second electrode spaced from the first electrode and extending in the first and second directions, wherein a first length of the second electrode in the first direction is substantially equal to a first length of the first electrode in the first direction, and a second length of the second electrode in the second direction is different from a second length of the first electrode in the second direction; a third electrode spaced from the first and second electrodes and extending in the first and second directions, wherein a first length of the third electrode in the first direction is substantially equal to the first length of the first electrode and a second length of the third electrode in the second direction is substantially equal to a length of the birdbeak portion in the second direction; and a plurality of test pads electrically connected to the first, second, and third electrodes, respectively, wherein the second lengths of the first and second electrodes are larger than the length of the birdbeak portion to the extent that the length of the birdbeak portion can be disregarded.

It is preferable that the second lengths of the first and second electrodes are at least approximately ten times larger than a thickness of the SOI layer.

It is also preferable that the first, second, and third electrodes have a comb-shaped structure having a plurality of fingers.

The second length of the third electrode, which is defined by the birdbeak portion, is substantially equal to a thickness of the SOI layer.

It is preferable that the evaluation TEG is arranged in an area of scribe line.

By employing the above-described TEG structure and method of extracting the capacitance of the MOS gate electrode, it is possible to extract capacitances of the main and parasitic regions separately. Also, since the evaluation TEGs having different widths W are formed together with elements requiring evaluation of electrical characteristics in the same wafer, the I–V characteristics and capacity characteristics are evaluated without considering the influence of process deviation between different wafers. In addition, since the evaluation of a single wafer is possible without breakdown, the embodiment is especially effective for an expensive SOI wafer.

(Second Embodiment)

In the second embodiment, is described a method of assuming the effective thickness $T_{ox,edge}$ of a gate oxide film of a parasitic element from the capacitance of the parasitic element extracted in the first embodiment.

FIGS. 8(a)–9(f) show the relation between the voltages of gate electrodes and the capacitance $C_{total}$ of the MOS gate when changing parameters. FIGS. 8(a)–9(f) are used to identify factors of defective. When the thickness $T_{ox}$ of the gate oxide film at an edge portion changes, the accumulation side (left-hand side in the drawings or negative side of $V_g$ in nMOS) of the capacitance of the MOS gate changes. When other parameters, such as an SOI density $N_{SIO}$, a SOI thickness $T_{SIO}$, a poly-silicon density, a BOX layer thickness, and a bulk density $H_{bulk}$, change, the accumulation side does not change. Accordingly, if the change of the capacitance in the accumulation side is found in the TEG data of a defective wafer by an abnormal leakage current, it can be assumed immediately that the thickness $T_{ox}$ of oxide film is the reason of the defective.

Similarly, when the poly-silicon density changes, only an inversion side (positive side of $V_g$) changes so that the reason can be identified. However, the SOI thickness $T_{SOI}$ and the SOI density $N_{SOI}$ have similar capacity characteristics around the interface between the accumulation and inversion sides so that another identification work is necessary. When the BOX layer thickness and the bulk density $N_{bulk}$ change, the capacitance hardly changes so that it is assumed that they can be disregard as process deviation is concerned.

As found from FIGS. 8(a)–9(f), in the capacity characteristics of the MOS gate in the SOI structure, only the gate oxide film thickness $T_{ox}$ is sensitive to the capacitance of the accumulation side. Therefore, the capacitance of the accumulation side is extracted by the method according to the first embodiment. In the accumulation side, electrical charges are accumulated on both sides of the gate oxide film so that the capacitance of the gate oxide film becomes large enough to disregard the other capacitance components $C_{SOI,edge}$, $C_{box}$, and $C_{bulk}$. That is, in the accumulation side, it can be taken as that the edge capacity is almost equal to the gate oxide film capacitance $C_{ox,edge}$. In order to obtain the effective thickness of the gate oxide film $T_{ox,edge}$, the extracted capacitance $C_{edge}$ of the accumulation side, a dielectric constant $\epsilon$, and an edge portion area $S_{edge}$ (the length L×the edge portion width $\Delta W$) are substituted in the following formula for obtaining the capacitance; $C_{edge} = \epsilon \times S_{edge}/T_{ox,edge}$.

Figures 4A, 4B:
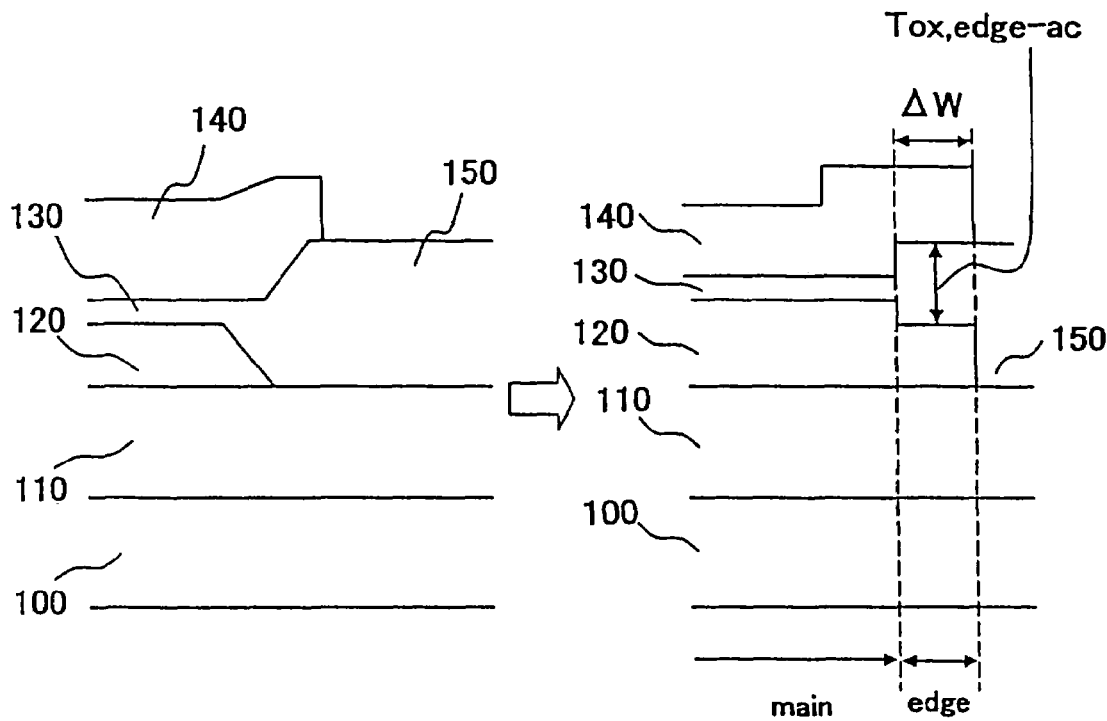
FIG. 4(a) is a sectional view of an edge portion according to the second embodiment of the present invention.
FIG. 4(b) is a diagram showing a structure of FIG. 4(a).

Here, in order to consider a structure to be evaluated, it should be replaced with a structure of a rectangle shown in FIG. 4(b) The actual shape of the structure to be evaluated is considered to have a more complicated shape. However, the purpose of the evaluation is not to obtain an accurate capacitance of the parasitic transistor but to check if the capacitance of the parasitic transistor is too large to disregard in comparison with the capacitance of transistors in the main region. Accordingly, approximation of the rectangle may be accepted for a simple calculation. If time and labor for the calculation permit, it is possible to obtain more accurate capacitance by assuming any other shape, such as a triangle and a trapezoid, for simulation.

Although it is possible to use the value calculated from process simulation or any other measured value for the width $\Delta W$, if the LOCOS is connected to the BOX layer, $\Delta W = T_{SOI,main}$ may be used as described above.

The reality is that a lift from the BOX layer is produced and the oxidation advances in a direction of the BOX layer by over-oxidation even after the LOCOS arrives at the BOX layer. However, since the triangle has a small area so that it is oxidized immediately and it is assumed that the width $\Delta W$ is smaller than the $T_{SOI,main}$. Whether or not the LOCOS is connected to the BOX layer is easily judged by examining the thickness of the oxide film through a color of the surface of a monitored wafer in oxidation process.

As described above, since the effective thickness of the gate oxide film in the SOI parasitic region is easily assumed by using the evaluation TEG, it is easily judged whether the thickness of the gate oxide film in the parasitic region is abnormal or not, thus identifying the reasons or factors for the hump characteristics. It is also of a great help for characteristics control upon mass-production, if controlling the parameters by replacing a complicated shape with a simplified shape. In addition, it is possible to monitor a contingent change of the film thickness caused by process deviation by controlling the film thickness with the TEG formed in wafers upon mass-production.

Third Embodiment

In the third embodiment, is described a method of assuming an effective thickness $T_{SOI,edge}$ of the SOI film by using the first and second embodiments.

Figure 5:
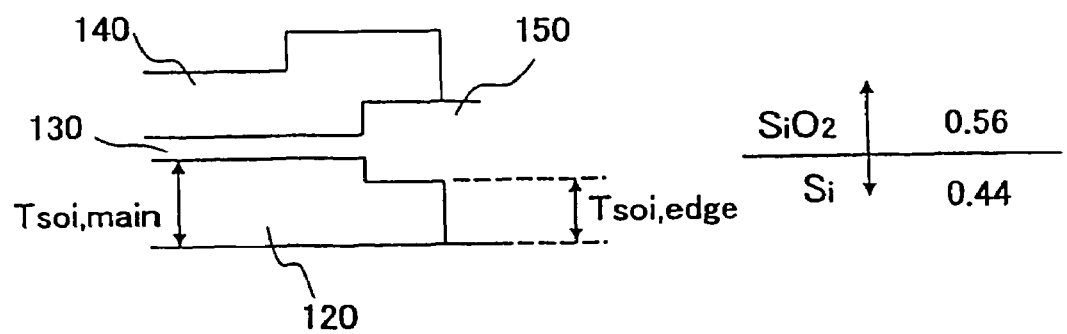
FIG. 5 is a sectional view of an edge portion and a diagram showing a growth rate of an oxide film according to the third embodiment of the present invention.

FIG. 5 shows a simplified sectional view of the edge portion and a developmental proportion of the oxide film. It is well known that when Si is oxidized to form $SiO_2$, the oxidation is developed with a proportion of Si=0.44 and $SiO_2$=0.56. Accordingly, $T_{soi,edge}$ is obtained from the below-mentioned formula using $T_{ox,\ edge}$ which is extracted according to the second embodiment.

Actually, there is some lift from the BOX layer, however, since the lift by the over-oxidation and the reduction of the width $\Delta W$ offset the influence on the capacitance, it can be neglected. More specifically, in the formula $C_{SOI,edge}=\epsilon \times S_{edge}/T_{SOI,edge}$, which is the formula to obtain a capacitance $C_{SOI,edge}$, if the width $\Delta W$ is reduced, $S_{edge}$ and $T_{SOI,edge}$ are also reduced so that the two reductions offset each other, causing little influence on $C_{SOI,edge}$.

Thus, since the effective thickness of the SOI layer in the SOI parasitic region is easily assumed by using the evaluation TEG, it is easily judged weather the thickness of the SOI layer in the parasitic region is abnormal or not, thus identifying the reasons or factors for the hump characteristics. Since it is well known that when the thickness of the SOI layer becomes small, the threshold voltage reduces and the leakage current increases, the process condition should be controlled such that the thickness of the edge portion is not smaller than the thickness $T_{soi}$ the SOI layer of the transistor in the main region.

(Fourth Embodiment)

In the fourth embodiment, is described a method of assuming the degree of depletion in the gate electrode in the parasitic region, for example, in poly-silicon (Poly), by using the first and second embodiments.

First, the depletion of the Poly will be described. The impurity density in the gate Poly made by leading process is usually determined by impurity ion implantation and heat treatment. When the energy of the ion implantation is high, the volume of dose is large, or the temperature of heat treatment is high, impurity penetrates into the SOI layer region under the gate. Accordingly, the implantation energy and the dose volume are generally controlled to be stall.

At this point, sometimes the Poly on an SOI layer side is not filled up by impurity and therefore, the depletion is produced. The depletion of the Poly has characteristics apparently similar to the characteristics produced under the condition that $T_{ox}$ becomes thick when positive voltage, in case of nMOS, is applied to the gate. When the depletion is larger, that is, when the impurity density of the lower Poly (hereinafter "Poly density") is smaller, the capacitance of the inversion side (positive voltage is applied on the gate) becomes smaller or oscillates unstably.

Figure 9D:
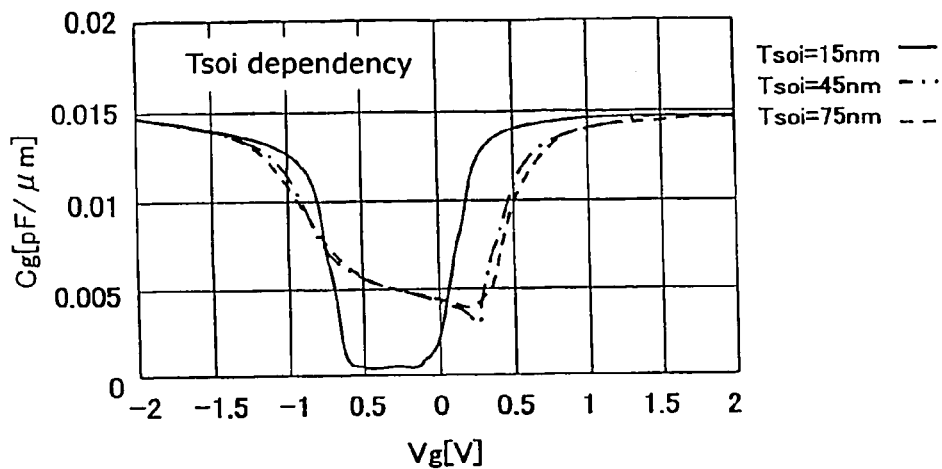
Figure 9E:
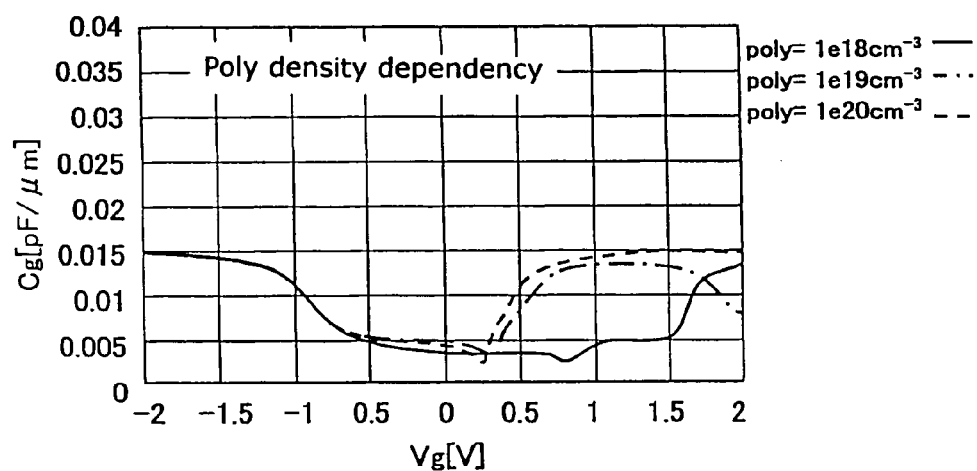
Figure 9F:
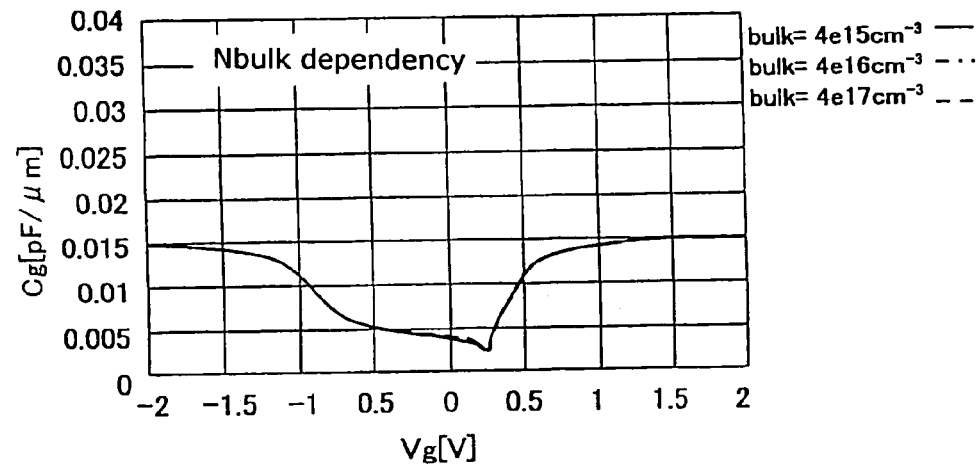

In FIG. 9(*e*), when the Poly density is 1e20 cm$^{-3}$, the accumulation side and the inversion side have an equal value of capacitance. However, when the Poly density is reduced, the capacitance of the inversion side becomes smaller than that of the accumulation side, which shows the presence of the depletion in the Poly. The parameter which is sensitive to the capacitance of the inversion side is only Poly density so that the degree of the depletion in the Poly in the parasitic element portion is evaluated as follows.

(1) Extract the capacitance of the accumulation side $C_{edge-ac}$ by using the first embodiment.

(2) Calculate the film thickness of the accumulation side $T_{ox,edge-in}$ by using the second embodiment.

(3) Extract the capacitance of the accumulation side $C_{edge-in}$ by using the first embodiment.

(4) Calculate the film thickness of the accumulation side $T_{ox,edge-in}$ by using the second embodiment.

(5) Evaluate the degree of the depletion in the Poly when $T_{ox,edge-in}<T_{ox,edge-ac}$.

Technical words used hereinafter, an accumulation region, an inversion region, and a weak accumulation/weak inversion region, have the following definitions.

The accumulation region is a region where holes are accumulated in the channel in case of an n-channel MOS or electrons are accumulated in the channel in case of a p-channel MOS when negative voltage is applied to the gate of the n-channel MOS or positive voltage is applied to the gate of the p-channel MOS, respectively. In the accumulation region, sufficiently large positive or negative voltage is applied to the gate until the holes or electrons are accumulated sufficiently to make the MOS capacitance substantially constant with the thickness and sectional area of the gate oxide film regardless of the SOI film thickness and SOI density.

The inversion region is a region where electrons are accumulated in the channel in case of an n-channel MOS or holes are accumulated in the channel in case of a p-channel MOS when positive voltage is applied to the gate of the n-channel MOS and negative voltage is applied to the gate of the p-channel MOS, respectively, so that the polarity is inverted to the opposite of the polarity of the substrate (p-type in case of the former and n-type in case of the latter). In the inversion region, sufficiently large positive or negative voltage is applied to the gate until the polarity is inverted sufficiently to make the MOS capacitance substantially constant with the thickness of the gate oxide film and the degree of the depletion of the Poly electrode regardless of the SOI film thickness and SOI density.

The weak accumulation/inversion region is a region extending from the area where the accumulation is a little weaker than the above-described sufficiently accumulated region (the area where the capacitance thereof is approximately 10% less than that of the sufficiently accumulated area) to the area where the inversion is a little weaker than the above-described sufficiently inverted region (the area where the capacitance thereof is a little less than that of the sufficiently inverted region). The capacitance of the weak accumulation/inversion region depends upon the SOI film thickness and SOI density. When 10% of the gate electrode is made depletion, the capacitance of the inversion side fluctuates so that it becomes difficult to define the area of which capacitance is 10% less than that of the sufficiently inverted region. Accordingly, the weak accumulation/inversion region is defined as a region of which gate voltage turns from that of the accumulation region to that of the inversion region.

Figure 10A:
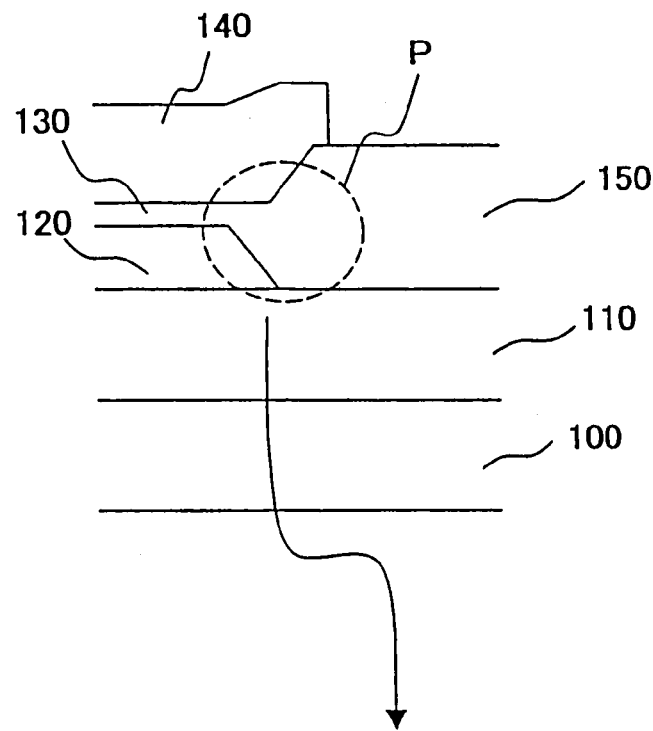
FIGS. 10(a) (b) are diagrams showing a structure of a parasitic transistor, wherein (a) is a sectional diagram of an edge portion and (b) is a diagram of a portion P in FIG. 10(a).
Figure 10B:
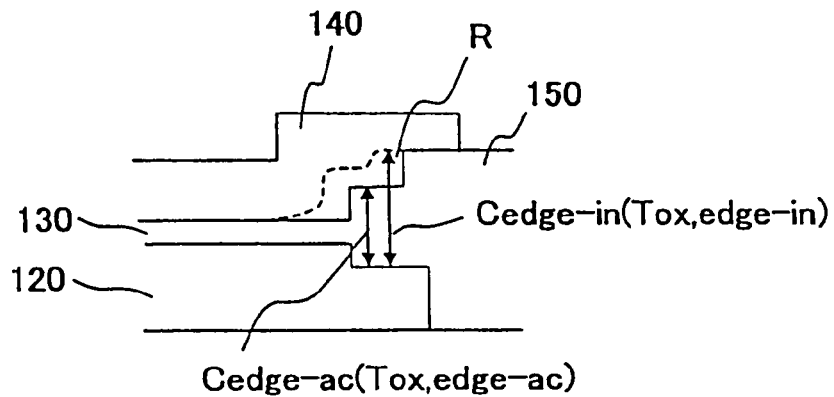
Figure 11:
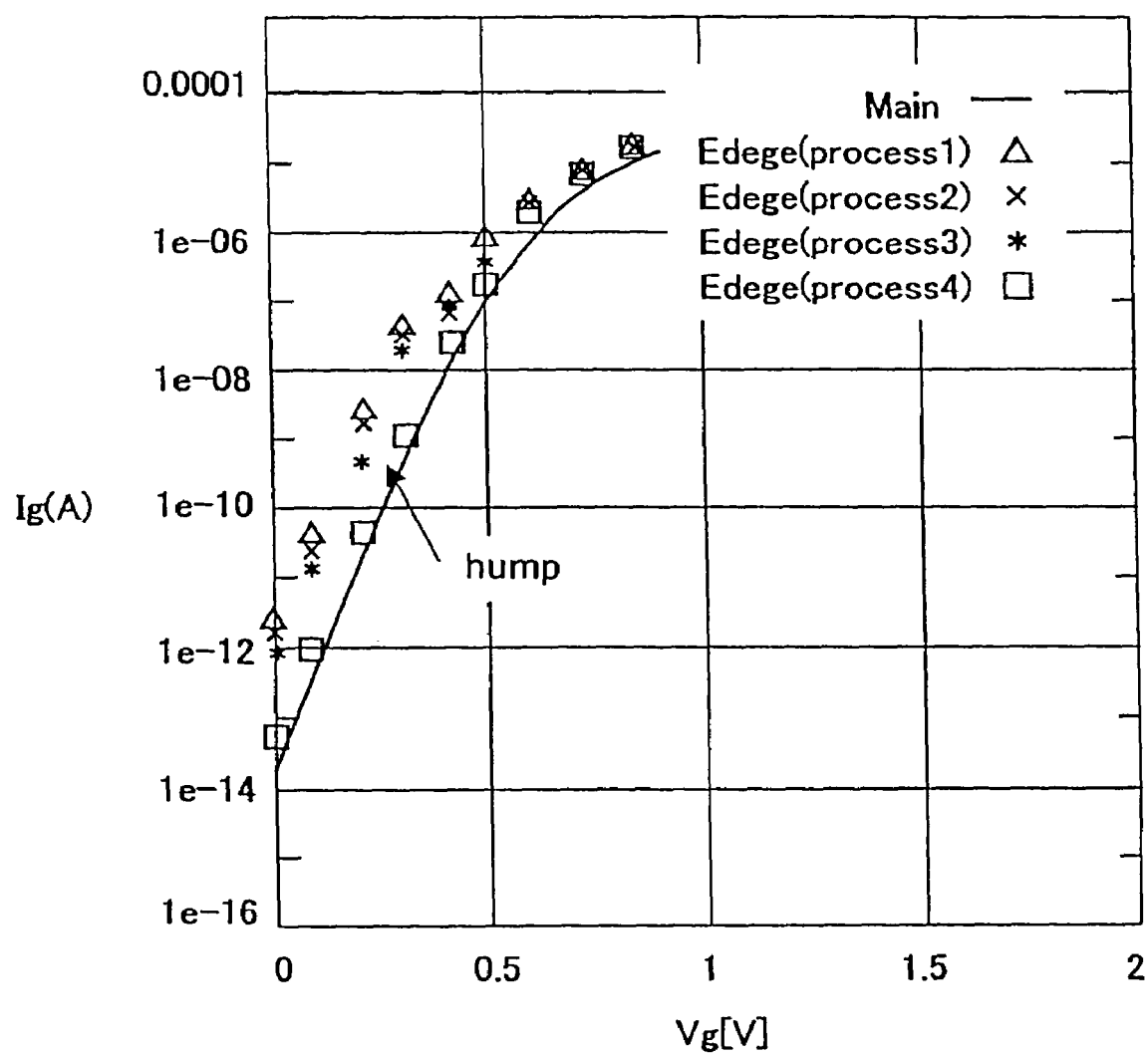
FIG. 11 is a graph showing sub-threshold characteristics of the gate when changing process.

As shown in FIG. 10(*b*), the capacitance of the sufficiently accumulated region (gate voltage) generally monitors the gate oxide film thickness at the edge portion. Accordingly, the film thickness $T_{ox,edge-ac}$ is extracted from the value of the capacitance thereof. By contrast, the capacitance of the sufficiently inverted region (gate voltage) includes the capacitance of a depletion area R of the gate electrode so that the film thickness $T_{ox,edge-in}$, which includes both the thicknesses of the sufficiently accumulated region $T_{ox,edge-ac}$ and the depletion area R is decided by the value of the capacitance thereof. Accordingly, the degree of the film thickness of the depletion area R can be assumed by subtracting the thickness $T_{ox,edge-ac}$ from the thickness $T_{ox,edge-in}$.

Since the gate capacitance of the accumulated region is decided only by the gate oxide film thickness, it is assumed that the gate capacitance of the inversion region, of which gate voltage is similarly made large to the positive side, is also decided by the gate oxide film thickness. Accordingly, When the depletion in the Poly can be disregarded, the capacitances of the accumulation side and inversion side are considered substantially equal. When, however, the depletion in the Poly is too large to disregard, since it gives the same effect that the gate oxide film thickness becomes large (the capacitance becomes small), the capacitance of the inversion side becomes smaller than that of the accumulation side. The depletion is assumed by the degree thereof. For example, the thicknesses of accumulation and inversion sides are calculated and the difference between the two is assumed equal to the thickness produced by the depletion developed from the upper surface of the gate oxide film to the Poly. The depletion in the Poly is a phenomenon recognized in the inversion side only and utilized for the above purpose.

Thus, the depletion of in the Poly is easily assumed by using the evaluation TEG so that it is helpful to find any abnormality and investigate the factors of the hump characteristics. That is, when the depletion is found in the Poly, the gate oxide film thickness apparently becomes large and the leakage current increases so that an impurity implantation process condition is set, which prevents the production of the depletion.

(Fifth Embodiment)

In the fifth embodiment, is described a method of assuming an effective density $N_{SOI}$ in the SOI layer in the parasitic region by using the first to fourth embodiments.

Figure 8A:
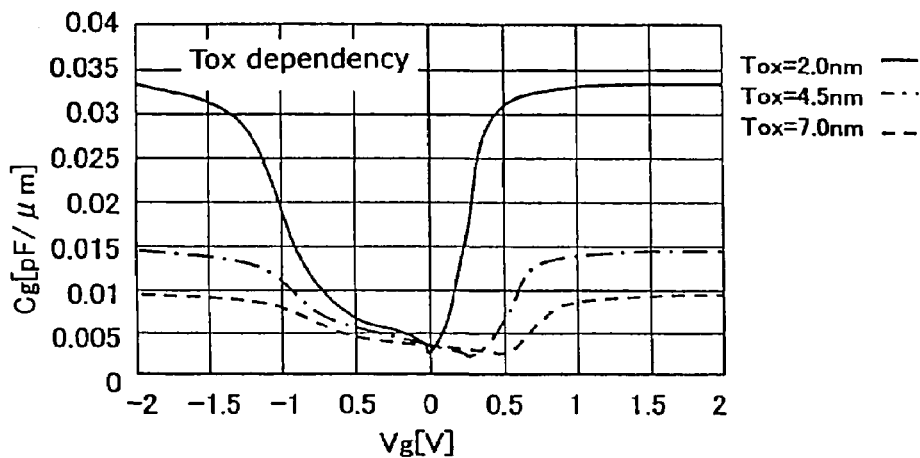
FIGS. 8(a) (b) (c) and FIGS. 9(d) (e) (f) are graphs showing a relation between a gate voltage and a MOS gate capacitance when changing parameters, wherein 8(a) shows a $T_{ox}$ dependency, 8(b) shows an $N_{SOI}$ dependency, 8(c) shows a BOX thickness dependency 9(d) shows a $T_{SOI}$ dependency, 9(e) shows a Poly density dependency, and 9(f) shows an $N_{bulk}$ dependency.
Figure 8B:
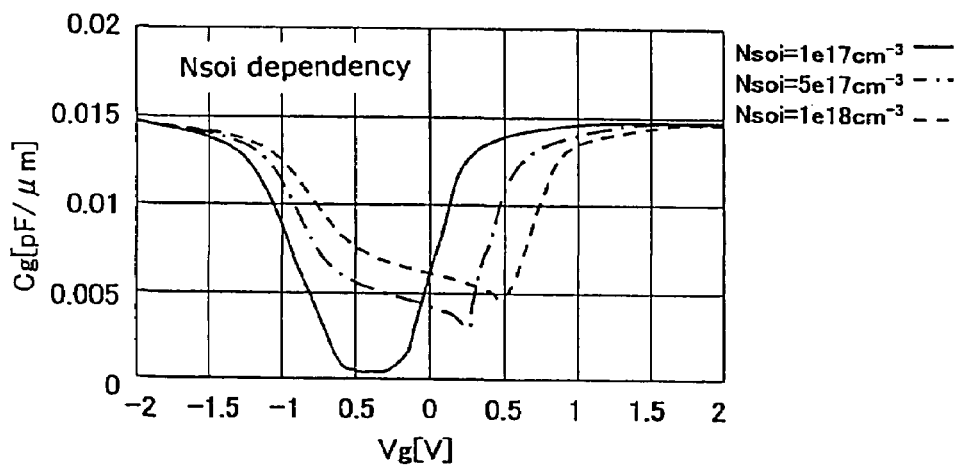
Figure 8C:
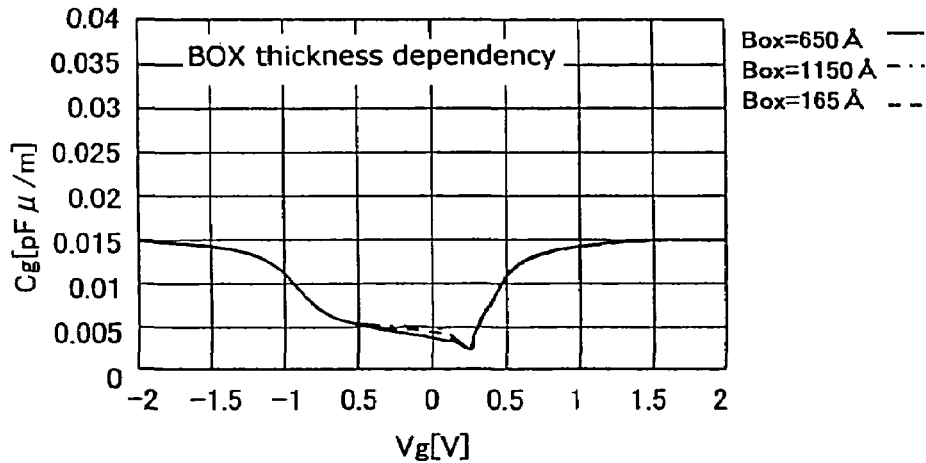

As shown in FIGS. 8(b) and 9(d), the capacitance of the weak accumulation/inversion region is especially sensitive to the SOI layer thickness $T_{SOI}$ and the SOI density $N_{SOI}$. Accordingly, it is difficult to determine which of the SOI layer thickness $T_{SOI}$ and the SOI density $N_{SOI}$ caused the change in the capacitance of the weak inversion region. Therefore, the SOI layer density at the edge portion is extracted as follows.

(1) Extract the capacitance $C_{edge}$ of the weak inversion region by using the first embodiment.

(2) Calculate the film thickness $T_{ox,edge}$ of the accumulation side by using the second embodiment.

(3) Extract $T_{SOI,edge}$ of using the third embodiment. If the value thereof is not normal, it is considered that not $N_{SOI}$ but $T_{SOI,edge}$ gives influences.

(4) Judge the degree of the depletion in the Poly using the fourth embodiment.

(5) Estimate the $N_{SOI}$ from the one-dimensional simulation by using the above parameters. Whereby, it is presumed that the influences of the BOX film thickness $T_{box}$ and the substrate density $N_{bulk}$ on the weak inversion region is small enough to disregard.

Thus, the impurity density in the SOI layer in the SOI parasitic region is easily assumed by using the evaluation TEG so that it is helpful to find any abnormality and investigate the factors of the hump characteristics. Also, it is helpful to estimate the impurity density to be added for the improvement of the hump. That is, when the change in the capacitance in the weak inversion region is found, since it is easily determined which of the $T_{SOI}$ and $N_{SOI}$ caused it, the process condition is established immediately.

The present invention is not limited to the above-described embodiments. It is obvious that various modifications and changes are possible within the technical concept recited in claims. Therefore, it should be understood that such modifications and changes belong to the technical concept of the present invention.

As fully described above, according to the invention, the capacitance of the gate parasitic region of a semiconductor device having the SOI structure is assumed by using the evaluation TEG so that it is possible to assume the parameters causing the hump characteristics through the capacitance. In addition, the above parameters can be checked by the evaluation TEG formed in each wafer without breaking down the wafer so that the cause of the hump characteristics is immediately located and time required for the evaluation and the wafer cost are reduced to large extent.

What is claimed is:

1. A method of evaluating a semiconductor device including a substrate, a dielectric layer, and an SOI layer formed in this order and further including a local oxidation of silicon (LOCOS) having a birdbeak portion, by using an evaluation test element group (TEG), wherein said evaluation TEG comprises:
   a first electrode extending in a first direction and a second direction crossing said first direction;
   a second electrode spaced from said first electrode and extending in said first and second directions, wherein a first length of said second electrode in said first direction is substantially equal to a first length of said first electrode in said first direction and a second length of said second electrode in said second direction is different from a second length of said first electrode in said second direction;
   a third electrode spaced from said first and second electrodes and extending in said first and second directions, wherein a first length of said third electrode in said first direction is substantially equal to said first length of said first electrode and a second length of said third electrode in said second direction is substantially equal to a length of said birdbeak portion in said second direction; and
   a plurality of test pads electrically connected to said first, second, and third electrodes, respectively, wherein said second lengths of said first and second electrodes are larger than said length of said birdbeak portion to the extent that said length of said birdbeak portion can be disregarded, said method comprising:
   disposing said TEG on said SOI layer via an oxide film; and
   finding a capacitance of said birdbeak portion in a third direction perpendicular to said first and second directions by applying a voltage between said test pads and said substrate.

2. The method according to claim 1, which further comprises the step of evaluating characteristics of a MOS constructing said semiconductor device by calculating, from said capacitance of said birdbeak portion, at least one of a thickness of an oxide film in said birdbeak portion, a thickness of said SOI layer in said birdbeak portion, and an impurity density of said SOI layer in said birdbeak portion.

3. The method according to claim 1, wherein said capacitance of said birdbeak portion is found by simplifying a sectional shape of said birdbeak portion in said third direction as substantially rectangular.

4. The method according to claim 2, wherein said capacitance of said birdbeak portion is found by simplifying a sectional shape of said birdbeak portion in said third direction as substantially rectangular.

5. The method according to claim 1, wherein said step of finding said capacitance of said birdbeak portion comprises:
   measuring capacitances of said first, second, and third electrodes in said third direction by applying a predetermined voltage between said test pads and said substrate;
   finding a linear relationship between said capacitances of said first and second electrodes and said lenghts of said first and second electrodes in said second direction from measured values of said capacitances of said first and second electrodes;
   finding a theoretical capacitance of said third electrode in said second direction from said linear relationship; and
   subtracting said theoretical capacitance from a measured value of said capacitance of said third electrode.

6. The method according to claim 2, wherein said step of finding said capacitance of said birdbeak portion comprises:
- measuring each capacitance of said first, second, and third electrodes in said third direction by applying a predetermined voltage between said test pads and said substrate;
- finding a linear relationship between said capacitances of said first and second electrodes and said lenghts of said first and second electrodes in said second direction from measured values of said capacitances of said first and second electrodes;
- finding a theoretical capacitance of said third electrode in said second direction from said linear relationship; and
- subtracting said theoretical capacitance from a measured value of said capacitance of said third electrode.

7. The method according to claim 2, wherein said step of finding said thickness of said oxide film in said birdbeak portion includes finding said capacitance of said birdbeak portion in an accumulation region to find said thickness of said oxide film from said capacitance of said birdbeak portion in said accumulation region and an area of said birdbeak portion, which is defined by said first and second directions.

8. The method according to claim 2, wherein said thickness of said SOI layer in said birdbeak portion is found by subtracting a product of a growth ratio of said oxide film on a silicon side and said thickness of said oxide film in said birdbeak portion from a thickness of SOI layer.

9. The method according to claim 1, wherein said first, second, and third electrodes are made of a poly-silicon and said method further comprises calculating a degree of each depletion of said electrodes in said birdbeak portion from said capacitance of said birdbeak portion to evaluate characteristics of a MOS constructing said semiconductor device.

10. The method according to claim 9, wherein said step of calculating said degree of said depletion of said electrodes includes:
- finding said capacitance of said birdbeak portion in an accumulation region;
- calculating a thickness of said oxide film in said birdbeak portion in said accumulation region;
- finding a capacitance of said birdbeak portion in an inversion region;
- calculating a thickness of said oxide film in said birdbeak portion in said inversion region; and
- comparing said thicknesses of said oxide films in said birdbeak portion in said accumulation and inversion regions.

11. The method according to claim 9, wherein said electrodes are made of a poly-silicon and said method further comprises:
- finding said capacitance of said birdbeak portion in a weak inversion region (parameter 1);
- finding a thickness of said oxide film in said birdbeak portion (parameter 2);
- finding a thickness of said SOI layer in said birdbeak portion (parameter 3);
- finding a degree of each depletion of said electrodes in said birdbeak portion (parameter 4); and
- calculating an impurity density of said SOI layer in said birdbeak portion by using said parameters 1–4.

* * * * *